United States Patent [19]

Nagasawa et al.

[11] Patent Number: 4,549,340

[45] Date of Patent: Oct. 29, 1985

[54] METHOD OF MAKING CMOS SEMICONDUCTOR DEVICE USING SPECIALLY POSITIONED, RETAINED MASKS, AND PRODUCT FORMED THEREBY

[75] Inventors: Kouichi Nagasawa, Kunitachi; Shuji Ikeda, Koganei; Norio Suzuki, Kodaira; Yoshio Sakai, Hachiouji, all of Japan

[73] Assignee: Hitachi, Ltd., Tokyo, Japan

[21] Appl. No.: 530,471

[22] Filed: Sep. 8, 1983

[30] Foreign Application Priority Data

Sep. 24, 1982 [JP] Japan ............... 57-164832

[51] Int. Cl.[4] ............... H01L 21/265; H01L 21/22; H01L 29/78
[52] U.S. Cl. ............... 29/571; 29/576 B; 148/1.5; 148/187; 357/42; 357/91
[58] Field of Search ............... 148/1.5, 187; 29/576 B, 29/571; 357/42, 91

[56] References Cited

U.S. PATENT DOCUMENTS

| | | | |
|---|---|---|---|
| 4,361,949 | 12/1982 | Hori et al. | 29/571 |
| 4,382,827 | 5/1983 | Romano-Moran et al. | 148/1.5 |
| 4,385,947 | 3/1983 | Halfacre et al. | 148/1.5 |
| 4,391,650 | 7/1983 | Pfeifer et al. | 148/1.5 |
| 4,409,726 | 10/1983 | Shiota | 29/576 B |
| 4,420,344 | 12/1983 | Davies et al. | 148/1.5 |
| 4,420,872 | 12/1983 | Zaldivar | 29/571 |
| 4,434,543 | 3/1984 | Schwabe et al. | 29/576 B |
| 4,435,895 | 3/1984 | Parrillo et al. | 29/571 |
| 4,435,896 | 3/1984 | Parrillo et al. | 29/571 |
| 4,459,741 | 7/1984 | Schwabe et al. | 29/576 B |

FOREIGN PATENT DOCUMENTS 1423183 7/1976 United Kingdom.
1499548 2/1978 United Kingdom.

OTHER PUBLICATIONS

Parrillo et al., IEEE-TEDM Tech. Digest, 1980, pp. 752–755.
Sakai et al., Jap. Jour. Appl. Phys., vol. 18, (1979), Suppl. 18-1, p. 73.
Ong, D., IEEE-Trans. Electron Device, ED-28, (1981), 6.

*Primary Examiner*—Upendra Roy
*Attorney, Agent, or Firm*—Antonelli, Terry & Wands

[57] ABSTRACT

Disclosed is a method of manufacturing a semiconductor device which includes MOSFETs of the two-channel conductivity types of P- and N-channel types on a single semiconductor substrate. According to the present invention, a first mask and a second mask are used. The first mask covers that surface part of the semiconductor substrate in which the P-channel type MOSFET is to be formed, and it serves as a mask when an N-type impurity is introduced into the semiconductor substrate. The first mask has a property and etching rate different from those of a film formed by the thermal oxidation of the semiconductor substrate surface. The second mask covers that surface part of the semiconductor substrate which has been formed with the N-channel type MOSFET, and it serves as a mask when a P-type impurity is introduced into the semiconductor substrate. The second mask is used as an inter-layer insulator film.

48 Claims, 16 Drawing Figures

METHOD OF MAKING CMOS SEMICONDUCTOR DEVICE USING SPECIALLY POSITIONED, RETAINED MASKS, AND PRODUCT FORMED THEREBY

BACKGROUND OF THE INVENTION

The present invention relates to a method of manufacturing a semiconductor device and, more particularly, to a method of manufacturing an MIS-type semiconductor integrated circuit (IC) device (e.g., an MOS IC) which is constructed of MOS (Metal Oxide Semiconductor) type transistors, for example.

CMOS (Complementary MOS) ICs, each of which has MOS transistors of the two opposite channel conductivity types of P- and N-channels, have such merits as very low power dissipation and high operating speed and are used for various circuits.

As a method for manufacturing the CMOS IC, a method to be stated below has generally been performed. First, a polycrystalline silicon film to become gate electrodes is formed on an N-type silicon semiconductor substrate and a P-type well region formed therein. The P-type well region is selectively covered with a silicon dioxide film ($SiO_2$ film) formed by chemical vapor deposition (CVD). Using the $SiO_2$ film as a mask, boron is diffused into the N-type silicon substrate not covered with the $SiO_2$ film, to form source and drain regions of the P+-type. Thereafter, the $SiO_2$ film is removed, that part of the surface of the N-type silicon semiconductor substrate in which the P-type well region is not formed is selectively covered with an $SiO_2$ film formed by CVD anew, and using this $SiO_2$ film as a mask, phosphorus is diffused into the surface of the P-type well region so as to form source and drain regions of the N-type. The $SiO_2$ film formed by CVD and used as the mask at the diffusion of phosphorus is removed. A new $SiO_2$ film as a passivation film is formed on the whole surface of the substrate by CVD. Contact holes are formed in the new $SiO_2$ film, and an Al film is evaporated on the whole surface and subsequently formed into Al electrodes by photolithography.

This method, however, has been found to incur the following problem by the inventors. When the $SiO_2$ film formed by CVD is removed by etching, the underlying field $SiO_2$ film is also etched partly. Consequently, a step arises in the surface of the field $SiO_2$ film. In case of forming Al wiring or the like over the field $SiO_2$ film, there is posed the problem that the Al wiring is liable to break at the step. The breakage of the Al wiring occurs noticeably particularly when the wiring of a polycrystalline silicon film is formed on the field $SiO_2$ film. The reason is that, when the $SiO_2$ film formed by CVD is etched, the field $SiO_2$ film under the wiring of the polycrystalline film is side-etched (under-etched), so that the step of the field $SiO_2$ film surface in this part (the distance from the surface of the wiring of the polycrystalline silicon film to the side-etched surface of the field $SiO_2$ film) becomes more abrupt (longer). Therefore, the breakage of the Al wiring due to the step is more liable to take place.

On the other hand, in recent years, researches have been made on the application of a double layer structure of polycrystalline silicon films to a CMOS IC. The inventors studied and produced a CMOS IC of the double layer structure by the use of the conventional manufacturing method described above. As a result, they encountered problems to be stated below. The second layer of polycrystalline silicon film deposited over the step part of the surface of the field $SiO_2$ film as described above is not sufficiently removed when etched in order to photolithographically work it into a predetermined pattern. Due to the deposited polycrystalline silicon film, a leakage current flows between the wiring leads of the second layer (level) of polycrystalline silicon film. As a measure for solving the problem, it is possible to render the wiring pitches of the polycrystalline silicon film large. This measure, however, requires a large wiring area and results in hampering enhancement in the density of integration.

Further, in manufacturing the CMOS IC which has the double-layer structure of the polycrystalline silicon films, the problem of a complicated process is involved when the conventional method of manufacturing the CMOS IC as described above is performed as it is. The reason is that, as explained before, the $SiO_2$ films formed by CVD are respectively used as the masks in the step of forming the N+-type source and drain regions and the step of forming the P+-type source and drain regions, and besides these $SiO_2$ films which serve as the masks, a new $SiO_2$ film formed by CVD is used as the inter-layer insulator film between the first layer of polycrystalline silicon film and the second layer of polycrystalline silicon film.

SUMMARY OF THE INVENTION

An object of the present invention is to provide a method of manufacturing a semiconductor device which can avoid a step developing due to the fact that the surface of a field oxide film is undesirably etched.

Another object of the present invention is to provide a manufacturing method which can produce a semiconductor device of multilayer structure without complicating a process, through a simple process.

According to the present invention, a method of manufacturing a semiconductor device comprises the step of covering a first semiconductor region of a first conductivity type with a first mask, the first semiconductor region being formed in a part of a semiconductor body in order to form a MISFET (e.g., a MOSFET) of a second channel conductivity type, and the step of covering a second semiconductor region of a second conductivity type with a second mask, the second semiconductor region being formed in another part of the semiconductor body in order to form a MISFET (e.g., a MOSFET) of a first channel conductivity type. The first mask, which differs in a property of, e.g., ability to be etched (e.g., etch rate) from, e.g., an oxide film formed by thermal oxidation of the semiconductor body, serves as a mask at the introduction of an impurity for forming the first channel conductivity type MOSFET. Since the first mask differs in such property from an oxide film formed by the thermal oxidation of the semiconductor body, the underlying film is not damaged when the first mask is removed by etching. The second mask serves as a mask at the introduction of an impurity for forming the second channel conductivity type MISFET (e.g., a MOSFET). The second mask is used as an inter-layer insulator film without any processing.

The above-mentioned objects and other objects of the present invention and the advantages thereof will be understood from the following description taken with reference to the drawings.

DESCRIPTION OF PREFERRED EMBODIMENTS

Figure 1A:
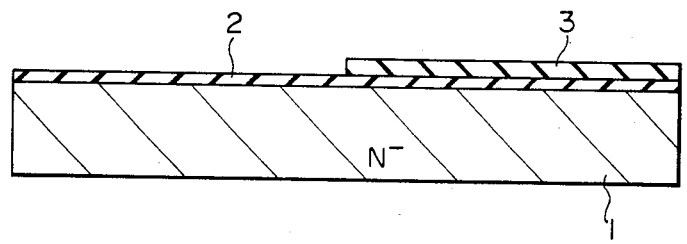
FIGS. 1A to 1N show the sectional structures of a CMOS IC at various steps in order to illustrate a method of manufacturing a semiconductor device according to an embodiment of the present invention.

First, as shown in FIG. 1A, one major surface of a silicon semiconductor substrate 1 of a first conductivity type, e.g., the $N^-$-type (having a resistivity of, e.g., 8–12 $\Omega$-cm) as a semiconductor body is thermally oxidized by conventional procedures to grow a silicon dioxide film ($SiO_2$ film) 2 having a thickness of, e.g., 430 Å. A silicon nitride film ($Si_3N_4$ film) 3 is formed on the $SiO_2$ film 2 by CVD and patterned by photolithography to form an oxidation impermeable mask made of the $Si_3N_4$ film 3.

Figure 1B:
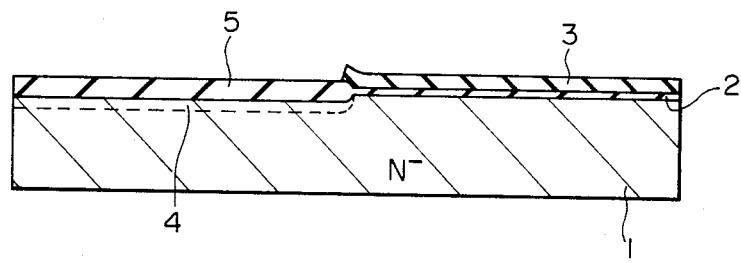

Subsequently, using the $Si_3N_4$ film 3 as a mask, ions of an impurity of the first conductivity type (in the present embodiment, of N type, e.g., the ions of phosphorus) are implanted into the surface of the substrate 1 under conditions of 125 keV and $2\times10^{12}/cm^2$. As a result, an ion-implanted layer 4 is formed. Further, using the $Si_3N_4$ film 3 as a mask, that region of the major surface of the substrate in which the ion-implanted layer 4 is formed is locally oxidized thermally. Thus, that region of the major surface of the substrate is covered with an $SiO_2$ film 5 being, e.g., 1200 Å thick, as shown in FIG. 1B.

Figure 1C:
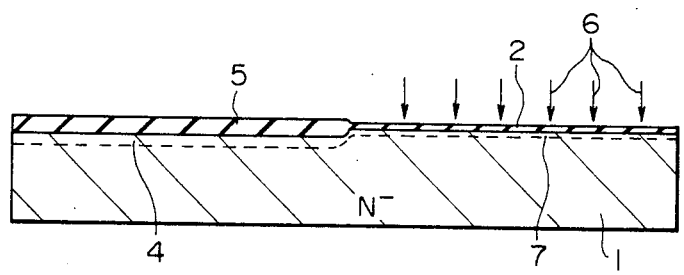

Subsequently, the $Si_3N_4$ film 3 is removed by etching, e.g., either wet etching or dry etching. Further, the ions of an impurity of a second conductivity type (in the present embodiment, P-type, e.g., the ions of boron fluoride, $BF_2$), indicated at numeral 6 (see FIG. 1C), are implanted under the conditions of, e.g., 60 keV and $3\times10^{12}/cm^2$. Here, the difference between the thicknesses of the $SiO_2$ film 2 and the $SiO_2$ film 5 is utilized, and a boron-implanted layer 7 is formed only under the thin $SiO_2$ film 2 as shown in FIG. 1C.

Figure 1D:
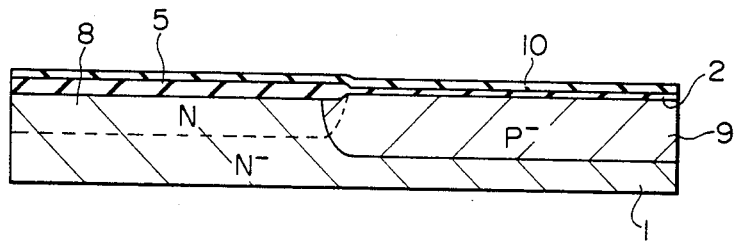

At the next step, the impurities of the ion-implanted layers 4 and 7 are diffused deep by a heat treatment of 1200° C. and 6 hours in a non-oxidizing atmosphere, e.g., nitrogen ($N_2$) gas. As a result, an N-type well region 8 as a first semiconductor region and a $P^-$-type well region as a second semiconductor region are respectively formed as shown in FIG. 1D. The first well region 8 serves to form a MOSFET of a second channel conductivity type or the P-channel conductivity type, while the second well region 9 serves to form a MOSFET of a first channel conductivity type or the N-channel conductivity type. Thereafter, an $Si_3N_4$ film 10, which is an oxidation impermeable film, is deposited on the whole surface by CVD.

Figure 1E:
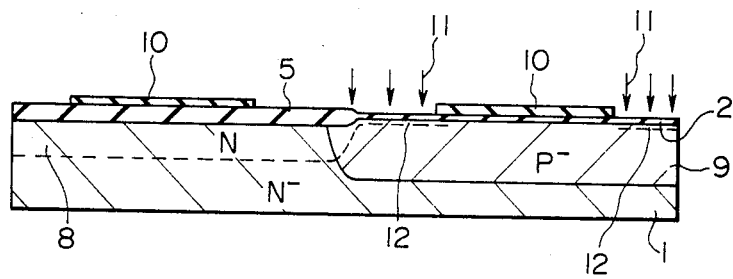

Subsequently, as shown in FIG. 1E, the $Si_3N_4$ film 10 is patterned by, e.g., conventional photolithography into a pattern which determines regions for forming the elements. Further, ions of a P-type impurity, e.g., boron fluoride ($BF_2$), indicated at numeral 11, are implanted into the silicon substrate 1 through only the thin $SiO_2$ film 2 under conditions of 60 keV and $3\times10^{13}/cm^2$. At this time, the $Si_3N_4$ film 10 and the $SiO_2$ film 5 serve as a mask. Thus, an ion-implanted layer 12 for a channel stopper is formed.

Figure 1F:
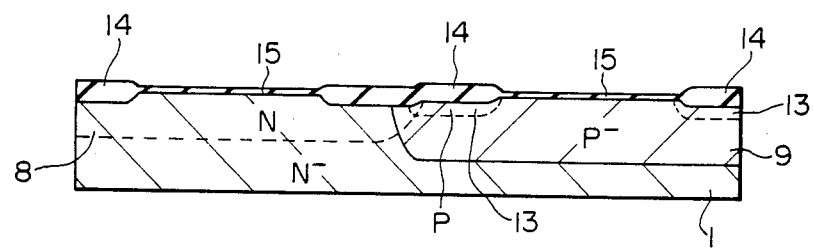

At the next step, using the $Si_3N_4$ film 10 as a mask, the silicon substrate is locally oxidized thermally (e.g., in steam, at a temperature of 1000° C. for 250 min.), to grow a field $SiO_2$ film 14 being about 9500 Å thick on selected areas. Simultaneously therewith, the impurity of the ion-implanted layer 12 is diffused to form a P-type channel stopper region 13. Thereafter, the $Si_3N_4$ film 10 is removed by etching, and also the $SiO_2$ films 2 and 5 having underlain the $Si_3N_4$ film 10 are removed by etching. As a result, those parts of the surface of the N-type silicon semiconductor substrate which correspond to the element forming regions are exposed. By thermally oxidizing the exposed surface parts, gate oxide films 15, being about 350 Å thick, are formed on the areas from which the $Si_3N_4$ film 10 and the $SiO_2$ films 2, 5 have been removed. This state is shown in FIG. 1F. The portions of the $P^-$-type well region 9 and N-type well region 8 formed with the gate oxide films 15 shall be called the "element forming regions".

Figure 1G:
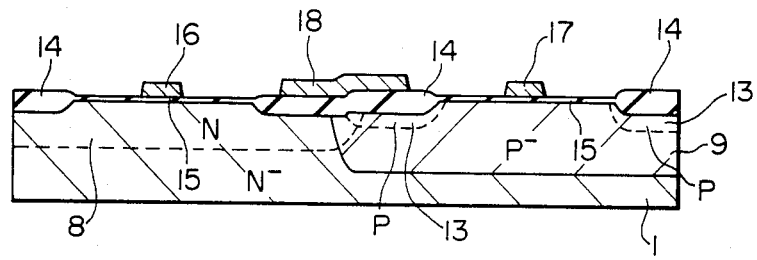

Next, a first-level polycrystalline silicon film of, e.g., 4000 Å thick is deposited on the whole surfaces of the element forming regions and the field $SiO_2$ film 14 by CVD. Phosphorus is introduced into this polycrystalline silicon film as an impurity, to render it low in resistivity (e.g., 30 $\Omega/\square$). Thereafter, the polycrystalline silicon film is patterned by photolithography into polycrystalline silicon layers to become the gate electrodes 16, 17 of the respective MOSFETs and a first-level polycrystalline silicon wiring lead 18 as shown in FIG. 1G. Boron ions for controlling the threshold voltages $V_{th}$ of the MOSFETs may well be implanted (e.g., under conditions of 60 keV and $10^{11}$–$10^{12}/cm^2$) into the surfaces of the element forming regions before forming the polycrystalline silicon layers.

Subsequently, steam oxidation is conducted at 875° C. for 10 minutes, to form silicon dioxide films 23 being about 400 Å thick on the surfaces of the polycrystalline silicon layers 16, 17 and 18.

Figure 1H:
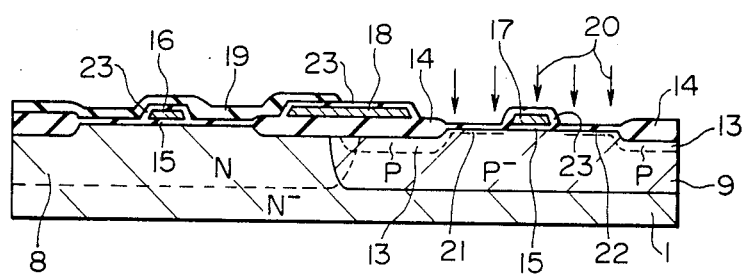

Next, an $Si_3N_4$ film 19 is formed on the $P^-$-type well region 9 and N-type well region 8 (on the whole surface of the substrate) by CVD. This film may be a film which differs in property from the underlying insulator film, i.e., field $SiO_2$ film. In other words, it may have an etching rate unequal to that of the field $SiO_2$ film. Using photoresist layers as a mask, the $Si_3N_4$ film 19 is selectively removed by a plasma etching process employing $CF_4+O_2$ gas, so as to be patterned into a predetermined shape. As can be seen in FIG. 1H, a part of the $Si_3N_4$ film left unetched may extend over a portion of the silicon dioxide film 23 on the surface of the polycrystalline silicon layer 18. At this time, owing to the unequal etching rates, the underlying films of the, e.g., field $SiO_2$ film 14 are not etched. Thus, a mask which covers the N-type well region 8 during introduction of an N-type impurity into the substrate is formed. Using the $Si_3N_4$ film 19 as the first mask under this state, an ion beam 20 of an N-type impurity, preferably arsenic, is projected into the $P^-$-type well region 9 under conditions of, e.g., 80 keV and $10^{16}/cm^2$. Then, arsenic-implanted layers 21 and 22 to become source and drain regions are formed in the surface parts of the $P^-$-type well region 9 located on both sides of the gate electrode 17. This state is shown in FIG. 1H. As a process for introducing this impurity, the ion implantation is preferred, but diffusion may well be resorted to. In using diffusion, the $SiO_2$ film 15 on the surface parts of the P⁻-type well region 9 to become the source and drain regions needs to be selectively removed at or before the diffusion. Conventional diffusion techniques may be utilized.

Figure 1I:
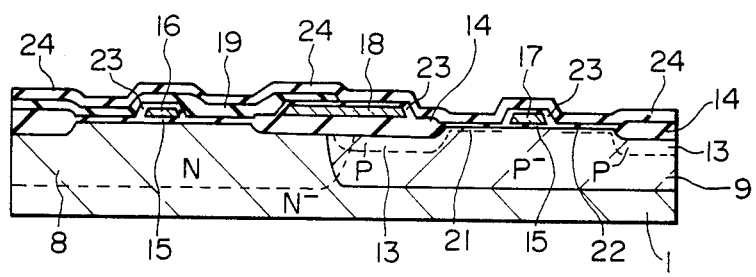

Subsequently, as shown in FIG. 1I, an $SiO_2$ film 24 is formed on the whole surfaces of the N-type well region 8 and P⁻-type well region 9 (on the whole surface of the substrate) by CVD. This film is used as an inter-layer insulator film between first-level and second-level polycrystalline silicon layers. It may well be replaced with a phosphosilicate glass (PSG) film. Such $SiO_2$ film 24, or PSG film, may have a thickness of, e.g., 150–250 nm. Essentially, the film 24 may differ in the etching rate from the underlying $Si_3N_4$ film 19. Thus, when the $Si_3N_4$ film 19 is removed, the film to be used as the inter-layer insulator film is prevented from being damaged; likewise, damage to the field $SiO_2$ film 14 is prevented.

Figure 1J:
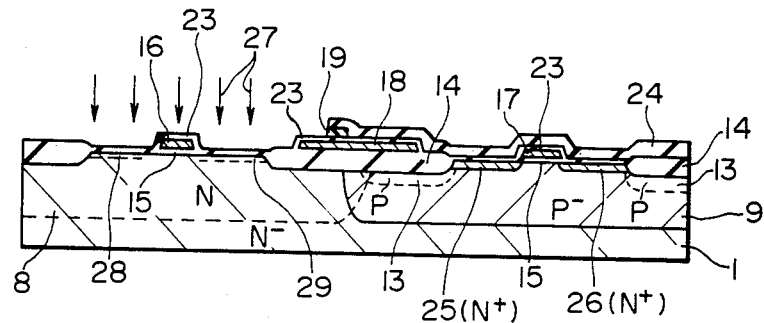

As shown in FIG. 1J, only that part of the $SiO_2$ film 24 which overlies the N-type well region 8 is removed by etching by the use of an etchant containing HF and $NH_4F$ at a mixing ratio of 1:6. Next, the $Si_3N_4$ film 19 underlying that part is removed by a plasma etching process employing $CF_4+O_2$ gas. Herein, the end part of the $SiO_2$ film 24 remaining unetched should desirably lie on the remaining part of the $Si_3N_4$ film 19 as shown in FIG. 1J. In this way, a step is reliably prevented from appearing in the field $SiO_2$ film 14 on account of the etching of the $SiO_2$ film 24. By annealing the resultant structure in a non-oxidizing atmosphere, e.g., nitrogen atmosphere (e.g., at 1000° C. for 20 min.), the impurity of the arsenic-implanted layers 21, 22 is subjected to the drive-in diffusion, to form the source region 25 and drain region 26 of the N-type. Thus, the N-channel type MOSFET, which is the first channel conductivity type MOSFET, is finished up. Further, using as the second mask the $SiO_2$ film 24 which is left on the P⁻-type well region 9, the surface of the N-type well region 8 is irradiated with, e.g., boron ions 27, e.g., under conditions of 30 keV and $1.5 \times 10^{15}/cm^2$. Using the gate electrode 16 and the $SiO_2$ film 23 on the side surface thereof as a mask, boron-implanted layers 28 and 29 to become source and drain regions are respectively formed on both sides of the gate electrode 16.

Figure 1K:
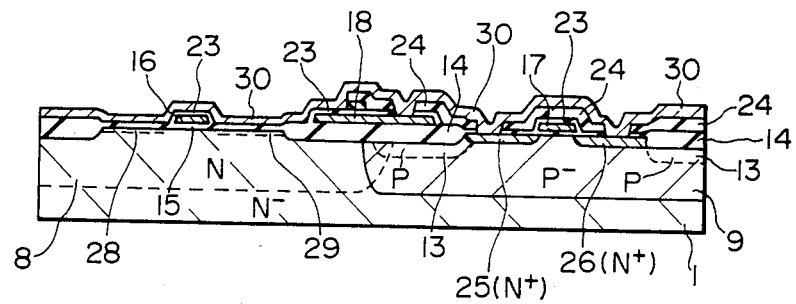

After the $SiO_2$ films 24, 23 and 15 overlying the source region 25 and drain region 26 and the polycrystalline silicon wiring lead 18 have been removed by photolithography, a second-level polycrystalline silicon film 30 is deposited on the whole surface to a thickness of 2000 Å by CVD as shown in FIG. 1K.

Figure 1L:
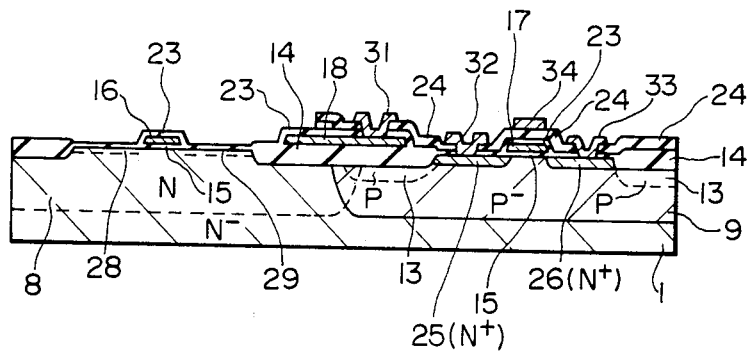

Subsequently, the polycrystalline silicon film 30 is worked by photolithography to form the second-level polycrystalline silicon layers 31, 32, 33 and 34 as shown in FIG. 1L. The polycrystalline silicon layers 31 and 34 are rendered low in resistivity (e.g., 80Ω/□) by introducing an impurity, e.g., phosphorus, and are used as wiring leads. The wiring leads of the second-level polycrystalline silicon film such as the polycrystalline silicon layers 31 and 34 are disposed on only the P-type well. Parts of the polycrystalline silicon layers 31 and 34 can be used as high resistance elements without introducing the impurity. No impurity is introduced into the polycrystalline silicon layers 32 and 33; these layers are rendered low in resistivity by the diffusion of Al atoms from Al wiring which is connected by a later step. The formation of contact holes is facilitated owing to the provision of the polycrystalline silicon layers 32 and 33.

Figure 1M:
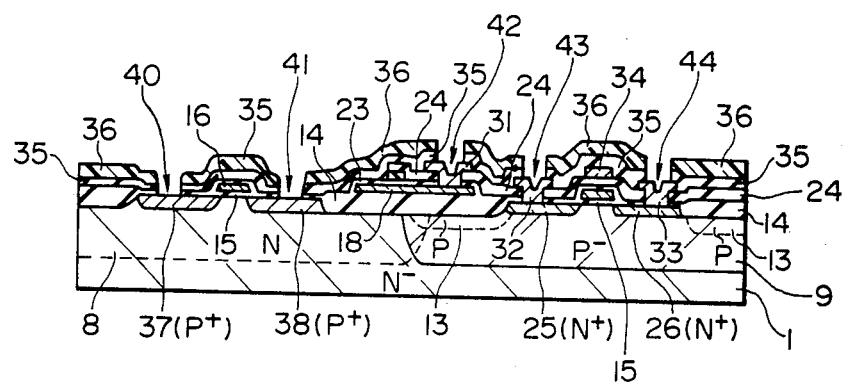

Subsequently, as shown in FIG. 1M, an $SiO_2$ film 35 and a phosphosilicate glass film 36 are deposited by CVD, whereupon they are worked by photolithography to form contact holes 40, 41, 42, 43 and 44. Thereafter, annealing at, e.g., 950° C. for 20 minutes is performed in a nitrogen atmosphere.

By this annealing, the boron implanted layers 28 and 29 undergo the drive-in diffusion, and the source region 37 and drain region 38 of the P-type are formed. Thus, the P-channel type MOSFET, which is the second channel conductivity type MOSFET, is finished up.

Figure 1N:
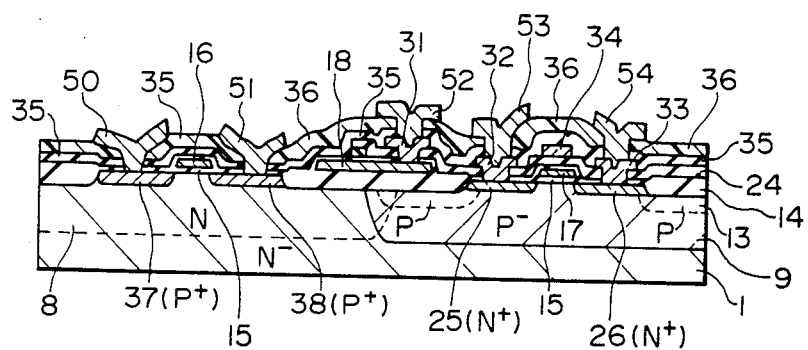

Subsequently, as shown in FIG. 1N, aluminum is deposited by vacuum evaporation and is patterned by photolithography to form aluminum wiring leads 50, 51, 52, 53 and 54. Further, after annealing the resultant structure, e.g., at 450° C. in hydrogen gas $H_2$ for 60 minutes, the whole surface is covered with a final passivation film, e.g., a silicon nitride film formed by plasma CVD. Then, the manufacturing process ends.

According to the present invention, the $Si_3N_4$ film 19, which differs in etching rate from the field $SiO_2$ film 14, is used as the first mask at the time at which the N-type impurity is ion-implanted into the second well region 9 of the P⁻-type as in the step illustrated in FIG. 1H. Therefore, when the $Si_3N_4$ film 19 is removed, the underlying field $SiO_2$ film 14 is not etched. Moreover, the CVD $SiO_2$ film 24, which serves as the second mask at the ion implantation of the P-type impurity into the first well region 8 of the N-type, is left as the inter-layer insulator film even after the ion implantation of the P-type impurity. Therefore, the underlying field $SiO_2$ film 14 is not etched. Accordingly, no step develops in the surface of the field $SiO_2$ film 14, so that the breakage of the Al wiring lead formed over the $SiO_2$ film, attributed to the step, or the occurrence of leakage current between the polycrystalline silicon wiring leads, can be prevented. Further, the process does not become complicated because a new inter-layer insulator film is not formed by removing the second mask after the introduction of the P-type impurity, as in the prior art. Especially in forming a CMOS IC having the double-layer structure of polycrystalline silicon, the invention is effective because it can be formed without complicating the process.

The present invention is not restricted to the foregoing embodiment, but can be variously modified. By way of example, while the embodiment has been explained as to the double-layer structure employing the polycrystalline silicon films, the present invention is also applicable to a case of forming a multilayer structure having a material other than the polycrystalline silicon film, for example, a multilayer structure including layers of refractory metals such as molybdenum and tantalum, or a multilayer structure including a refractory metal layer and a polycrystalline silicon film. In addition, the embodiment has been explained as to the case of first performing the ion implantation of the N⁺-type impurity to form the N-channel type MOSFET being the first channel conductivity type MOSFET, and thereafter performing the ion implantation of the P⁺-type impurity to form the P-channel type MOSFET being the second channel conductivity type MOSFET. However, the reverse case is also possible where, after forming the source and drain regions of a P-channel type MOSFET as the first channel conductivity type MOSFET, the source and drain regions of an N-channel type MOSFET as the second channel conductivity type MOSFET are formed. In this case, an insulator film formed on the P-channel type MOSFET is used as a mask for forming the source and drain regions of the N-channel type MOSFET, and it is left intact and is used as an inter-layer insulator film.

The $Si_3N_4$ film 19 shown in FIG. 1H may well be replaced with a polycrystalline silicon film. Essentially, the film 19 differs in the etching rate from the underlying field $SiO_2$ film.

In the step illustrated in FIG. 1H, the oxide film which is formed on the surfaces of the polycrystalline silicon films 16, 17 and 18 may be an $SiO_2$ film formed by CVD, instead of the thermal oxidation film formed by the steam oxidation described before. Since, however, this $SiO_2$ film formed by the CVD is liable to overetching, the thermal oxidation film is more favorable.

As the material 24 of the second mask is shown in FIG. 1I, it is necessary to select a film which can be used as the inter-layer insulator film and which is good in coverage and in quality. While the $SiO_2$ film formed by the CVD as mentioned in the foregoing embodiment is a favorable concrete material, a PSG film is also exemplified as being favorable. Since $Si_3N_4$ film traps charges at an interface, it is not favorable as the inter-layer insulator film. In addition, the steps illustrated in FIGS. 1I and 1J may well be carried out by an expedient as stated below. After the N-type impurity ions 20 have been implanted into the surface of the $P^-$-type well region 9 by employing the $Si_3N_4$ film 19 as the first mask as illustrated in FIG. 1H, a portion of the $Si_3N_4$ film 19 is removed with hot phosphoric acid, whereupon the $SiO_2$ film 24 for forming the second mask is formed by CVD on the whole surfaces of the N-type well region 8 and $P^-$-type well region 9. Thereafter, the $SiO_2$ film 24 on the N-type well region 8 is selectively removed to obtain substantially the same structure as shown in FIG. 1J.

The present invention described above is effective particularly when applied to a static RAM in which a memory cell is constructed of N-channel type MOSFETs within a P-type well region and load resistors made of a polycrystalline silicon film, and a CMOS circuit is used for a peripheral circuit, to render the power dissipation low, which is shown in Japanese Patent Application No. 56-15733. In this case, the load resistors of the memory cell and wiring therefor are formed of the second-level polycrystalline silicon layer.

Figure 2:
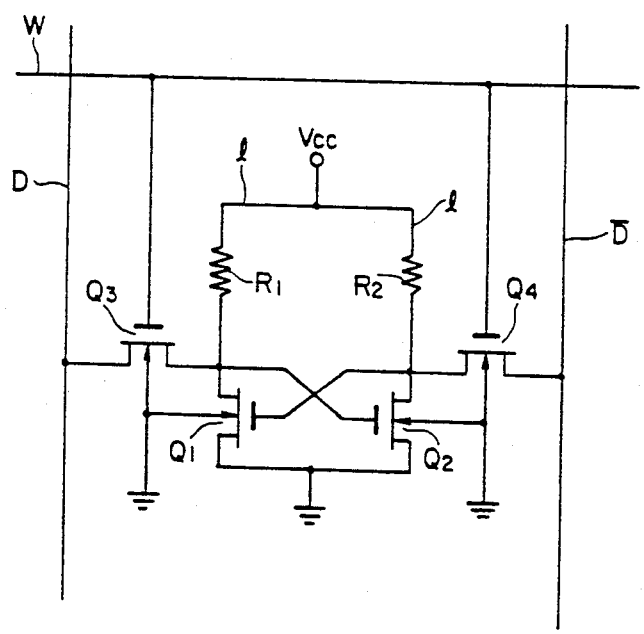
FIG. 2 is an equivalent circuit diagram showing a memory cell of a static RAM which can be formed utilizing the present invention.
Figure 3:
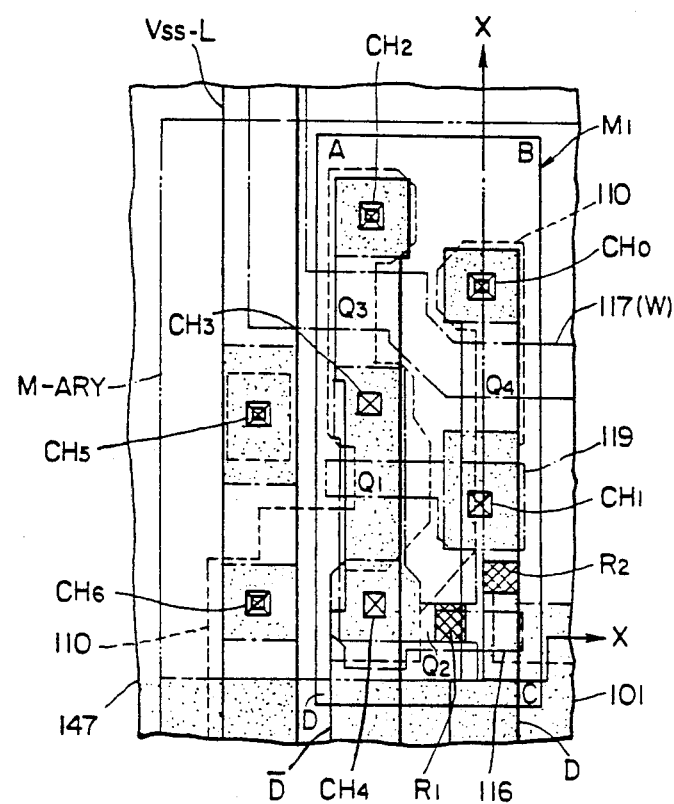
FIG. 3 is an enlarged top plan view showing the memory cell of FIG. 2.

The circuit of the memory cell in one bit of a static RAM which can be formed utilizing the present invention is shown in FIG. 2, with the layout pattern of the memory cell M-CEL of one bit shown in FIG. 3.

Referring to FIG. 2, the memory cell is composed of a flip-flop, which is constructed of inputs and outputs of a pair of inverter circuits, such composed of a load resistor and a driver transistor connected in series; and a pair of transmission gate MISFETs $Q_3$ and $Q_4$. The paired inverter circuits are composed of a first inverter, which has a load resistor $R_1$ and a driver MISFET $Q_1$ connected in series, and a second inverter which has a load resistor $R_2$ and a driver MISFET $Q_2$ connected in series. The load resistors $R_1$ and $R_2$ have their one-side terminals fed with the voltage $V_{CC}$ through a wiring 1, whereas the driver MISFETs $Q_1$ and $Q_2$ have their source terminals grounded to the earth. Moreover, the output of the first inverter is fed to the gate terminal of the MISFET $Q_2$ of the second inverter, whereas the output of the second inverter is fed to the gate terminal of the MISFET $Q_1$ of the first inverter. The flip-flop having the construction thus far described is used as information memory means. Moreover, the output of the first inverter is connected through the MISFET $Q_3$ with a data line D, whereas the output of the second inverter is connected through the MISFET $Q_4$ with a data line $\overline{D}$. In other words, the transmission gate is used as address means for controlling the information transmission between the flip-flop and the complementary data line couple D and $\overline{D}$ and has its operations controlled by the address signal which is to be impressed upon a word line W.

Referring to FIG. 3, a section surrounded by the rectangle ABCD is a region which is occupied by the memory cell M-CEL of one bit. On the other hand, broken lines indicate a thick field insulation film 110 made of $SiO_2$, and single dotted lines indicate a polycrystalline silicon layer. In particular, the regions which are enclosed by the single dotted lines but not studded with points indicate first polycrystalline silicon layers 117, 119 and 116. Moreover, the regions studded with points indicate a second polycrystalline silicon layer 147 and a second polycrystalline layer over contact holes $CH_0$, $CH_2$, $CH_5$ and $CH_6$. Double-dotted lines indicate a memory array M-ARY which is composed of a plurality of memory cells. This memory array is a P-type well region which is formed in the N-type semiconductor substrate. Letters D, $\overline{D}$ and $V_{SS}-L$ indicate wiring layers made of aluminum. Among these, more specifically, the letters D and $\overline{D}$ indicate the complementary data line couple shown in FIG. 2, and letters $V_{SS}-L$ indicate the earth potential supply line. On the other hand, the contact holes $CH_0$, $CH_2$ and $CH_6$ are provided to connect the wiring layers D, $\overline{D}$ and $V_{SS}-L$ with the $N^+$-drain region of the MISFET $Q_4$, the $N^+$-type drain region of the MISFET $Q_3$ and the $N^+$-type source region shared between the MISFETS $Q_1$ and $Q_2$ respectively. The second polycrystalline silicon layer is sandwiched between those aluminum wiring layers and the $N^+$-type semiconductor regions. The contact hole $CH_5$ is provided to connect the P-type well regions of the wiring layer $V_{SS}-L$ and the memory array M-ARY while sandwiching the second polycrystalline silicon layer in between. The contact holes $CH_1$, $CH_3$ and $CH_4$ are provided to connect the second polycrystalline silicon layer 147 with the first polycrystalline silicon layer 119, the $N^+$-type region, which is shared between the drain region of the MISFET $Q_1$ and the source region of the MISFET $Q_3$, and the first polycrystalline layer 116, respectively.

Herein, in the present invention, a polycrystalline silicon layer to form the gate electrode of a MOSFET which constitutes the CMOS circuit of the peripheral circuit is formed simultaneously with the first-level polycrystalline silicon layer which forms the MOSFETs for the memory cells. The second polycrystalline silicon layer is unnecessary in the peripheral circuit. As the insulator film between the second-level polycrystalline silicon layer and the first-level polycrystalline silicon layer which is the gate electrode of the N-channel type MOSFET of the memory cell, a mask at the diffusion of a P-type impurity is used. Thus, the static RAM of low power dissipation can be formed without resorting to a complicated process, for example.

The invention is applicable not only to the above static RAM, but also to a semiconductor integrated circuit device in which a CMOS circuit and bipolar transistors are formed on a single substrate. Besides, the present invention is applicable to any semiconductor device formed of a CMOS circuit.

What is claimed is:

1. A method of manufacturing a semiconductor device at least in part in a semiconductor body, said semiconductor body including in its major surface a first semiconductor region of a first conductivity type and a second semiconductor region of a second conductivity type, said major surface being divided into a plurality of regions by an isolation area which isolates the plurality of regions, comprising the steps of:
   (b) covering said first semiconductor region with a first mask which has different etching characteristics than that of said isolation area;
   (c) introducing an impurity of the first conductivity type selectively into said second semiconductor region by the use of said first mask;
   (d) covering said second semiconductor region with a second mask which has different etching characteristics than that of said first mask, said second mask being formed at least in part by depositing a material which forms said second mask;
   (e) removing said first mask except parts covered with said second mask, by etching;
   (f) introducing an impurity of the second conductivity type selectively into said first semiconductor region by the use of said second mask; and
   (k) forming a first conductor layer selectively on said second mask after performing said step (f).

2. A method of manufacturing a semiconductor device according to claim 1, wherein said isolation area is formed by an oxide material.

3. A method of manufacturing a semiconductor device according to claim 1, including the further step of:
   (a) preparing the semiconductor body which includes in its major surface a first semiconductor region of a first conductivity type and a second semiconductor region of a second conductivity type, said major surface being divided into a plurality of regions by an isolation area which isolates the plurality of regions.

4. A method of manufacturing a semiconductor device according to claim 1, further comprising the steps of:
   (g) forming a gate oxide film on the areas of said major surface which are not formed with said isolation areas, after performing said step (a);
   (h) forming a second conductor layer selectively on the thin oxide film after performing said (g), said second conductor layer serving as a mask for introducing the impurities at said steps (c) and (f) and also as gate electrodes;
   (i) said step (c) including impurity introduction for forming a source or drain region of a first channel conductivity type MOSFET; and
   (j) said step (f) including impurity introduction for forming a source or drain region of a second channel conductivity type MOSFET.

5. A method of manufacturing a semiconductor device according to claim 1, wherein said second mask at least in part comprises an inorganic material.

6. A method of manufacturing a semiconductor device according to claim 1, wherein said material for forming said second mask is deposited by chemical deposition.

7. A method of manufacturing a semiconductor device according to claim 3, wherein said isolation area is constituted by a thick oxide film, and said thick oxide film is formed by thermal oxidation of the semiconductor body.

8. A method of manufacturing a semiconductor device according to claim 7, further comprising the steps of:
   (g) forming a gate oxide film thinner than said thick oxide film on areas of said major surface which are not formed with said thick oxide film, after performing said step (a);
   (h) forming a second conductor layer selectively on the thin oxide film after performing said step (g), said second conductor layer serving as a mask for introducing the impurities at said steps (c) and (f) and also as gate electrodes;
   (i) said step (c) including impurity introduction for forming a source or drain region of a first channel conductivity type MOSFET; and
   (j) said step (f) including impurity introduction for forming a source or drain region of a second channel conductivity type MOSFET.

9. A method of manufacturing a semiconductor device according to claim 8, wherein said gate oxide film is formed by thermal oxidation of said semiconductor body.

10. A method of manufacturing a semiconductor device according to claim 9, wherein said second conductor layer is made of a polycrystalline silicon layer.

11. A method of manufacturing a semiconductor device according to claim 9, wherein said first mask is made of a silicon nitride film.

12. A method of manufacturing a semiconductor device according to claim 9, wherein said first conductivity type is an N type, while said second conductivity type is a P type, and said first channel conductivity type MOSFET is an N-channel type MOSFET, while said second channel conductivity type MOSFET is a P-channel type MOSFET.

13. A method of manufacturing a semiconductor device according to claim 9, wherein, prior to forming said first second conductor layer, ions of the second conductivity type are implanted into the surfaces of the first and second semiconductor regions for controlling threshold voltages of the MOSFETs.

14. A method of manufacturing a semiconductor device according to claim 9, wherein said etching in step (e) is performed by plasma etching process.

15. A method of manufacturing a semiconductor device according to claim 11, wherein said second mask is made of a CVD silicon dioxide film.

16. A method of manufacturing a semiconductor device according to claim 11, wherein said second mask is made of a phosphosilicate glass film.

17. A method of manufacturing a semiconductor device according to claim 12, wherein parts of said first conductor layer have an impurity introduced therein so as to have a low resistivity, and the other parts thereof have a high resistivity.

18. A method of manufacturing a semiconductor device according to claim 17, wherein said semiconductor device is used as a semiconductor memory which includes memory cells that are made of the N-channel type MOSFETs and the high resistivity parts of said polycrystalline silicon layer.

19. A method of manufacturing a semiconductor device according to claim 18, wherein said second conductor layer is made of a polycrystalline silicon layer.

20. A method of manufacturing a semiconductor device according to claim 18, wherein said first mask is made of a silicon nitride film.

21. A method of manufacturing a semiconductor device according to claim 18, wherein said P-channel type MOSFET is for a peripheral circuit for the memory cells, whereby a static RAM is formed.

22. A method of manufacturing a semiconductor device according to claim 20, wherein said second mask is made of a CVD silicon dioxide film.

23. A method of manufacturing a semiconductor device according to claim 20, wherein said second mask is made of a phosphosilicate glass film.

24. A method of manufacturing a semiconductor device according to claim 14, wherein said plasma etching process employs $CF_4+O_2$ gas.

25. A method of manufacturing a semiconductor device according to claim 6, wherein said chemical deposition is chemical vapor deposition.

26. A method of manufacturing a CMOS integrated circuit at least in part in a semiconductor body, the semiconductor body including in its major surface a first semiconductor region of a first conductivity type and a second semiconductor region of a second conductivity type, said major surface being isolated into a plurality of regions, comprising the steps of:
   (b) covering said first semiconductor region with a first mask which has different etching characteristics than that of an oxide film;
   (c) introducing an impurity of the first conductivity type selectively into said second semiconductor region by the use of said first mask;
   (d) forming a second mask, covering said second semiconductor region, such that part of said second mask overlaps said first mask, said second mask being made of a material which has different etching characteristics than that of said first mask;
   (e) removing said first mask, except parts covered with said second mask, by etching; and
   (f) introducing an impurity of the second conductivity type selectively into said first semiconductor region by the use of said second mask,
   thereby providing first and second semiconductor elements, respectively, in said first and second semiconductor regions, to provide a CMOS integrated circuit.

27. A method of manufacturing a CMOS integrated circuit according to claim 26, wherein said second mask is formed by covering the surface of the semiconductor body, and the surface of the first mask, with the material of which the second mask is made, and patterning the material of which the second mask is made to form said second mask, said patterning being performed to provide overlap between the first and second masks.

28. A method of manufacturing a CMOS integrated circuit according to claim 26, comprising the further step of:
   (a) preparing said semiconductor body.

29. A method of manufacturing a semiconductor device according to claim 26, comprising the further step, after said introducing an impurity of the second conductivity type selectively into said first semiconductor region, of selectively forming a second conductor layer on said semiconductor body.

30. A method of manufacturing a CMOS integrated circuit according to claim 26, wherein the first and second masks are each made of inorganic materials.

31. A method of manufacturing a CMOS integrated circuit according to claim 29, wherein said second conductor layer is formed in part on said second mask, and wherein a portion of said second mask is retained to form a part of an inter-layer insulating film for said CMOS integrated circuit.

32. A method of manufacturing a CMOS integrated circuit according to claim 29, wherein the major surface is isolated into a plurality of regions by an isolation area, the method including the further steps of:
   ($g_1$) forming a gate oxide film on areas of said major surface which are not formed with said isolation area, after performing the step (a);
   ($g_2$) forming a first conductor layer selectively on the gate oxide film after performing said step ($g_1$), said first conductor layer serving as a mask for introducing the impurities at said steps (c) and (f) and also as gate electrodes;
   ($g_3$) said step (c) including impurity introduction for forming a source or drain region of a first channel conductivity type MOSFET;
   ($g_4$) said step (f) including impurity introduction for forming a source or drain region of a second channel conductivity type MOSFET; and
   ($g_5$) forming said second conductor layer on said body, said second conductor layer being formed in part on said second mask, whereby said second mask acts as an inter-layer insulating layer for said CMOS integrated circuit.

33. A method of manufacturing a CMOS integrated circuit according to claim 26, wherein a part of said second mask is retained in the CMOS integrated circuit to form a part of a passivation film for the CMOS integrated circuit.

34. A method of manufacturing a CMOS integrated circuit according to claim 26, wherein forming the second mask includes the step of depositing said material which forms the second mask on the semiconductor body, and wherein said mask is made at least in part of an inorganic material.

35. A method of manufacturing a CMOS integrated circuit according to claim 34, wherein the depositing of the material for forming the second mask is performed by chemically depositing the material.

36. A method of manufacturing a CMOS integrated circuit at least in part in a semiconductor body, the semiconductor body including in its major surface a first semiconductor region of a first conductivity type and a second semiconductor region of a second conductivity type, said major surface being isolated into a plurality of regions, comprising the steps of:
   (b) introducing an impurity of the first conductivity type into the second semiconductor region;
   (c) covering the second semiconductor region with a mask, said mask at least in part being formed of an inorganic material, said mask being formed by depositing a material which forms said mask;
   (d) introducing an impurity of the second conductivity type selectively into said first semiconductor region by the use of said mask; and
   (e) forming a conductor layer, selectively, in part on said mask, said mask being retained at least in part in said CMOS integrated circuit.

37. A method of manufacturing a CMOS integrated circuit according to claim 36, wherein the retained part of the mask constitutes at least part of the passivation film for the CMOS integrated circuit.

38. A method of manufacturing a CMOS integrated circuit according to claim 36, wherein the retained part of the mask constitutes at least part of an inter-layer insulating layer for the CMOS integrated circuit.

39. A method of manufacturing a CMOS integrated circuit according to claim 36, comprising the further step of:
(a) preparing said semiconductor body.

40. A method of manufacturing a CMOS integrated circuit at least in part in a semiconductor body, the semiconductor body including in its major surface a first semiconductor region of a first conductivity type and a second semiconductor region of a second conductivity type, said major surface being isolated into a plurality of regions by a thick oxide film, comprising the steps of:
(b) forming a first conductor layer on said semiconductor body, said first conductor layer including a portion thereof on said thick oxide film;
(c) covering said first semiconductor region with a first mask which has different etching characteristics than that of said oxide film, said first mask having a portion thereof extending onto the portion of the first conductor layer on the thick oxide film;
(d) introducing an impurity of the first conductivity type selectively into said second semiconductor region by the use of said first mask;
(e) covering said secnd semiconductor region with a second mask which has different etching characteristics than that of said first mask, said second mask extending onto the portion of the first conductor layer on the thick oxide film;
(f) removing said first mask, except parts covered with said second mask, by etching, whereby the first mask is removed without etching of the thick oxide film; and
(g) introducing an impurity of the second conductivity type selectively into said first semiconductor region by the use of said second mask.

41. A method of manufacturing a CMOS integrated circuit device according to claim 40, comprising the further step of:
(a) preparing said semiconductor body.

42. A method of manufacturing a CMOS integrated circuit device according to claim 40, wherein said first conductor layer is formed on said semiconductor body via oxide films.

43. A method of manufacturing a CMOS integrated circuit device according to claim 40, wherein said first mask extends onto the portion of the first conductor on the thick oxide film via an oxide film on said portion of the first conductor layer.

44. A method of manufacturing a semiconductor device at least in part in a semiconductor body, the semiconductor body including in its major surface a plurality of semiconductor regions, said plurality of semiconductor regions including a first semiconductor region of a first conductivity type and a second semiconductor region of a second conductivity type, at least the first and second semiconductor regions being isolated by isolation regions of said semiconductor body, said isolation regions including an oxide material, comprising the steps of:
(b) introducing an impurity of the first conductivity type selectively into said second semiconductor region;
(c) covering said second semiconductor region with a mask of an inorganic material, said mask being formed at least in part by depositing a material which forms said mask;
(d) introducing an impurity of the second conductivity type selectively into said first semiconductor region by the use of said mask; and
(e) forming a conductor layer selectively on said second mask after performing said step (d), whereby the mask is retained at least in part in said semiconductor device.

45. A method of manufacturing a CMOS integrated circuit device according to claim 44, including the further step of:
(a) preparing said semiconductor body.

46. A method of manufacturing a semiconductor device according to claim 44, wherein the impurity of the first conductivity type is selectively introduced into the second semiconductor region by covering the first semiconductor region with another mask which has different etching characteristics than that of said oxide film and introducing the impurity of the first conductivity type by use of the another mask; wherein said another mask has different etching characteristics than that of said mask; and wherein said another mask is removed by etching, the another mask being removed while substantially preventing etching of said mask and said oxide film.

47. A method of manufacturing a semiconductor device according to claim 46, wherein said mask is formed to overlap said another mask, and, in removing said another mask, the parts thereof covered by said mask are retained.

48. A method of manufacturing a semiconductor device according to claim 47, wherein said semiconductor device is a CMOS integrated circuit.

* * * * *